US008067884B2

(12) United States Patent
Li

(10) Patent No.: US 8,067,884 B2
(45) Date of Patent: Nov. 29, 2011

(54) LED LIGHTING ARRANGEMENT INCLUDING A SUBSTANTIALLY SPHERICAL OPTICAL COMPONENT HAVING A SURFACE PARTIALLY COATED WITH A LIGHT EMITTING PHOSPHOR

(75) Inventor: Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 148 days.

(21) Appl. No.: 12/624,839

(22) Filed: Nov. 24, 2009

(65) Prior Publication Data

US 2010/0067216 A1    Mar. 18, 2010

Related U.S. Application Data

(63) Continuation of application No. 11/640,533, filed on Dec. 15, 2006.

(60) Provisional application No. 60/835,601, filed on Aug. 3, 2006.

(51) Int. Cl.
*H01L 33/50* (2010.01)
*H01L 33/58* (2010.01)

(52) U.S. Cl. ........ 313/501; 313/503; 313/110; 313/512; 362/255; 362/293; 362/311.06; 362/311.02; 257/100

(58) Field of Classification Search .......... 313/498–512, 313/110–117; 257/98–100; 362/255, 800, 362/555, 311.01–311.1, 293
See application file for complete search history.

(56) References Cited

U.S. PATENT DOCUMENTS

| 5,371,434 | A | 12/1994 | Rawlings |
| 6,555,958 | B1 | 4/2003 | Srivastava et al. |
| 6,576,930 | B2 | 6/2003 | Reeh et al. |
| 6,614,170 | B2 | 9/2003 | Wang et al. |
| 6,717,353 | B1 | 4/2004 | Mueller et al. |
| 6,834,979 | B1 * | 12/2004 | Cleaver et al. ............... 362/219 |
| 7,029,935 | B2 | 4/2006 | Negley et al. |
| 7,663,315 | B1 * | 2/2010 | Hulse ............................ 313/512 |
| 7,686,478 | B1 * | 3/2010 | Hulse et al. .................. 362/255 |

(Continued)

FOREIGN PATENT DOCUMENTS

CA    2466979 A1    11/2005

(Continued)

OTHER PUBLICATIONS

Yoo, J.S., et al., Control of spectral properties of strontium-alkaline earth-silicate-europium phosphors for LED applications, Journal of the Electrochemical Society, Apr. 1, 2005, pp. G382-G385, vol. 152, No. 5.

(Continued)

*Primary Examiner* — Mariceli Santiago
(74) *Attorney, Agent, or Firm* — Fliesler Meyer LLP

(57) ABSTRACT

A lighting arrangement comprising: a light reflective enclosure; at least one radiation source housed within the enclosure and operable to generate excitation light of a first wavelength range; a substantially spherical optical component mounted over the enclosure opening and at least one phosphor operable to absorb at least a portion of the excitation light and to emit light of a second wavelength range, wherein light generated by the arrangement comprises the combined light of the first and second wavelength ranges and wherein the at least one phosphor material is provided as a layer on at least a part of the surface of the optical component that is enclosed within the volume of the enclosure when the component is mounted to the enclosure.

21 Claims, 4 Drawing Sheets

U.S. PATENT DOCUMENTS

| | | | |
|---|---|---|---|
| 7,943,951 B2 * | 5/2011 | Kim et al. | 257/100 |
| 2001/0000622 A1 | 5/2001 | Reeh et al. | |
| 2002/0047516 A1 | 4/2002 | Iwasa et al. | |
| 2003/0052595 A1 | 3/2003 | Ellens et al. | |
| 2004/0016908 A1 | 1/2004 | Hohn et al. | |
| 2004/0104391 A1 | 6/2004 | Maeda et al. | |
| 2004/0183081 A1 * | 9/2004 | Shishov et al. | 257/79 |
| 2004/0227465 A1 | 11/2004 | Menkara et al. | |
| 2004/0239242 A1 * | 12/2004 | Mano et al. | 313/512 |
| 2005/0051782 A1 | 3/2005 | Negley et al. | |
| 2005/0057917 A1 | 3/2005 | Yatsuda et al. | |
| 2005/0093430 A1 | 5/2005 | Ibbetson et al. | |
| 2005/0168127 A1 | 8/2005 | Shei et al. | |
| 2006/0028122 A1 | 2/2006 | Wang et al. | |
| 2008/0246044 A1 * | 10/2008 | Pang | 257/98 |

FOREIGN PATENT DOCUMENTS

| | | |
|---|---|---|
| JP | 07-094785 A | 4/1995 |
| RU | 2114492 C1 * | 6/1998 |
| WO | 02/07228 A1 | 1/2002 |
| WO | 2006/022792 A2 | 3/2006 |

OTHER PUBLICATIONS

Park, J.K., et al., Optical properties of $Eu^{2+}$-activated $Sr_2SiO_4$ phosphor for light-emitting diodes, Electrochemical and Solid-State Letters, Feb. 25, 2004, pp. H15-H17, vol. 7, No. 5.

Barry, T., Fluorescence of $Eu^{2+}$-activated phases in binary alkaline earth orthosilicate systems, Journal of the Electrochemical Society, Nov. 1968, pp. 1181-1184, vol. 115, No. 1.

* cited by examiner

LED LIGHTING ARRANGEMENT INCLUDING A SUBSTANTIALLY SPHERICAL OPTICAL COMPONENT HAVING A SURFACE PARTIALLY COATED WITH A LIGHT EMITTING PHOSPHOR

CROSS REFERENCE TO RELATED APPLICATIONS

This application is a continuation of U.S. patent application Ser. No. 11/640,533, filed Dec. 15, 2006 by Yi-Qun Li, entitled "LED Lighting Arrangement Including Light Emitting Phosphor" which claims the benefit of priority to U.S. Provisional Application No. 60/835,601, filed Aug. 3, 2006 by Yi-Qun Li, entitled "Phosphor-Containing Optical Components for LED Illumination Systems".

BACKGROUND OF THE INVENTION

1. Field of the Invention

This invention relates to solid-state lighting applications which comprise light emitting diodes (LEDs) which include a light emitting phosphor, photoluminescent material, to generate light of a desired color, that is in a different part of the wavelength spectrum from the LEDs. In particular, although not exclusively, the invention concerns LED-based lighting arrangements which generate light in the visible part of the spectrum and in particular, although not exclusively white light. Moreover the invention provides an optical component for such a lighting arrangement and methods of fabricating a lighting arrangement and an optical component. Furthermore the invention provides a phosphor material for coating an optical component or as a part of optical designs in lighting arrangements.

2. State of the Art

In the context of this patent application light is defined as electromagnetic radiation in a wavelength range 300 nm (Ultraviolet) to 1000 nm (Infrared). Primarily, although not exclusively the invention concerns lighting arrangements which emit light in the visible part of the spectrum that is 380 to 750 nm.

White light emitting diodes (LEDs) are known in the art and are a relatively recent innovation. It was not until LEDs emitting in the blue/ultraviolet of the electromagnetic spectrum were developed that it became practical to develop white light sources based on LEDs. As is known white light generating LEDs ("white LEDs") include a phosphor, that is a photoluminescent material, which absorbs a portion of the radiation emitted by the LED and re-emits radiation of a different color (wavelength). For example the LED emits blue light in the visible part of the spectrum and the phosphor re-emits yellow light. Alternatively the phosphor can emit a combination of green and red light, green and yellow or yellow and red light. The portion of the visible blue light emitted by the LED which is not absorbed by the phosphor mixes with the yellow light emitted to provide light which appears to the eye as being white. A known yellow phosphor is a YAG-based phosphor having a main emission wavelength peak that varies in wavelength range from 530 to 590 nm depending on the composition of the phosphors. Further examples of phosphors are described in our co-pending patent application US 2006/0028122 in which the photoluminescent materials have a formula $A_2SiO_4:Eu^{2+}D$ where A is a divalent metal selected from the group consisting of Sr, Ca, Ba, Mg, Zn and Cd and D is a dopant selected from the group consisting of F, Cl, Br, I, P, S and N. Such phosphors emit light of intensities that are greater than either known YAG compounds or silicate-based phosphors.

It is predicted that white LEDs could potentially replace incandescent light sources due to their long operating lifetimes, typically many 100,000 of hours, and their high efficiency. Already high brightness LEDs are used in vehicle brake lights and indicators as well as traffic lights and flash lights.

To increase the intensity of light emitted from an LED it is known to include a lens made of a plastics material or glass to focus the light emission and to thereby increase intensity. Referring to FIG. 1 a high brightness white LED 2 is shown. The LED 2 comprises an LED chip 4 which is mounted within a plastic or metal reflection cup 6 and the LED chip is then encapsulated within an encapsulating material, typically an epoxy resin 8. The encapsulation material includes the phosphor material for providing color conversion. Typically the inner surface of the cup 6 is silvered to reflect stray light towards a lens 10 which is mounted on the surface of the encapsulating epoxy resin 8.

The inventor has appreciated that such an arrangement has limitations and the present invention arose in an endeavor to mitigate, at least in part, these limitations. For example for high intensity LEDs having a high intensity output larger than 1 W, the high temperature at the output of the LED combined with its close proximity the phosphor material can give rise to a light characteristic which is temperature dependent and in some cases thermal degradation of the phosphor material can occur. Moreover the uniformity of color of light emitted by such LEDs can be difficult to maintain with the phosphor distributed within the epoxy resin since light passing through different path lengths will encounter and be absorbed by differing amounts of phosphor. Furthermore the fabrication of such LEDs is time consuming due to the encapsulation and subsequent placement of the lens.

SUMMARY OF THE INVENTION

According to a first aspect of the invention there is provided a lighting arrangement comprising: a radiation source configured to emit radiation having a first wavelength range; a phosphor configured to absorb at least a portion of said first wavelength range radiation and emit radiation having a second wavelength range; and an optical component through which at least said first wavelength range radiation passes, characterized in that the phosphor is provided on a surface of the optical component. The invention provides the advantage of reducing the manufacturing steps and hence cost and also provides a more uniform color of output light.

Advantageously the phosphor is provided as a substantially uniform thickness layer on said surface of the optical component. Such an arrangement ensures a more uniform color of emitted light.

The optical component can have a number of forms and typically comprises a lens for focusing the radiation to increase the intensity of the emitted light. Alternatively the optical component can be for directing the radiation thus acting as a waveguide or as a window through which the radiation passes. The phosphor can be provided on inner or outer surfaces of the optical component and this will determine whether said second wavelength range radiation also passes through the optical component. For example in one implementation the optical component has a substantially planar surface and the phosphor is provided on said substantially planar surface. An advantage of applying the phosphor to the planar surface is that it is easier to produce a uniform thickness layer. Alternatively the optical component can have a convex or concave surface and the phosphor is provided on said convex or concave surfaces.

In one implementation the optical component has a substantially hemispherical surface and the phosphor is provided on said hemispherical surface. Preferably, the optical component comprises a substantially hemispherical shell and the phosphor is provided on the inner hemispherical surface. Alternatively the phosphor can be provided on at least a part of the outer hemispherical surface. In a further alternative embodiment the optical component comprises a substantially spherical shell and the phosphor is provided on at least a part of the inner or outer spherical surfaces. Such a form finds particular application as a light source for replacing incandescent light sources. In yet a further embodiment the optical component comprises a hollow cylinder and the phosphor is provided on at least a part of the inner or outer surfaces.

Advantageously, the optical component is made of a plastics material such as a polycarbonate and silicone or a glass such as a silica-based glass. The optical component comprises a material which is at least substantially transparent to said first wavelength range radiation and where the phosphor is provided on an inner surface of the component the material is further substantially transparent to the second wavelength range radiation.

In a preferred implementation the phosphor comprises a powder which is incorporated within an epoxy resin, a silicone material or a polymer material to form a mixture and the phosphor mixture is then applied to the optical component to form a layer of phosphor on the optical component surface. To improve the uniformity of light emitted from the lighting arrangement the phosphor mixture advantageously further incorporates a light diffusing material such as titanium oxide, silica, alumina, etc. Such a light diffusing material has as low an absorption of light as possible.

The phosphor advantageously comprises a phosphor which emits luminescent light when illuminated by radiation in wavelength range from 300 nm to 550 nm. One example of the phosphor advantageously comprises a YAG-based phosphor which comprises a photoluminescent material having a formula $(YA)_3(AlB)_5(OC)_{12}:Ce^{3+}$ where A is a trivalent metal selected from the group comprising Gd, Tb, La, Sm or divalent metal ions such as Sr, Ca, Ba, Mg, Zn and Cd, B comprising Si, B, P, and Ga and C is a dopant selected from the group comprising F, Cl, Br, I, P, S and N. In another implementation the phosphor comprises a photoluminescent material having a formula $A_2SiO_4:Eu^{2+}D$ where A is a divalent metal selected from the group comprising Sr, Ca, Ba, Mg, Zn and Cd and D is a dopant selected from the group comprising F, Cl, Br, I, P, S and N.

In yet a further embodiment an orange-red silicate-based phosphor having a formula $(SrM1)_3Si(OD)_5:Eu$ where M1 is selected from the group comprising Ba, Ca, Mg, Zn . . . and where D is selected from the group comprising F, Cl, S, and N. Such a phosphor is advantageously used for emitting light in a wavelength range from green to yellow (580 to 630 nm).

Alternatively the phosphor comprises a red silicon nitride based phosphor having a formula $(SrM1)Si_5N_8$ where M1 is selected from the group comprising Sr, Ca, Mg, and Zn.

In another embodiment the phosphor comprises a red sulfate based phosphor having a formula of $(SrM1)S$ where M1 is selected from the group comprising Ca, Ba, and Mg.

In yet another embodiment the phosphor can comprise a green sulfate based phosphor having a formula of $(SrM1)(GaM2)_2S_4:Eu$ where M1 is selected from the group comprising Ca, Ba, and Mg, and M2 is selected from the group comprising Al and In.

Preferably, the radiation source comprises a light emitting diode, advantageously a Gallium Nitride based LED.

The present invention finds particular application for white light sources and the radiation source is operable to emit radiation having a wavelength range of 300 to 500 nm. Preferably, the phosphor composition is configured to emit radiation having a wavelength ranging from 450 to 700 nm.

According to a second aspect of the invention there is provided an optical component for a lighting arrangement of a type comprising a radiation source configured to emit radiation having a first wavelength range; a phosphor configured to absorb at least a portion of said first wavelength range radiation and emit radiation having a second wavelength range; and said optical component configured such that at least said first wavelength range radiation passes through the optical component, and characterized in that said phosphor is provided on a surface of said optical component.

Such an optical component provides the advantages of reducing the manufacturing steps and hence cost and emits a more uniform color light. Moreover such an optical component can be used to provide direct color conversion in an LED arrangement.

To ensure the uniformity of color of light generated by the optical component, the phosphor is advantageously provided as a substantially uniform thickness layer on said surface of the optical component.

For ease of fabrication the optical component preferably has a substantially planar surface and the phosphor is provided on said substantially planar surface. Alternatively, the optical component has a convex or concave surface and the phosphor is provided on said convex or concave surfaces by for example spraying or printing related coating methods.

In one implementation the optical component has a substantially hemispherical surface and the phosphor is provided on said hemispherical surface. The optical component can comprise a substantially hemispherical shell and the phosphor is provided on the inner hemispherical surface. Such an arrangement provides environmental protection of the phosphor. Alternatively, the phosphor is provided on the outer hemispherical surface. In a further embodiment the optical component comprises a substantially spherical shell and the phosphor is provided on at least a part of the inner or outer spherical surfaces. In yet a further implementation the optical component comprises a hollow cylinder and the phosphor is provided on at least a part of the inner or outer surfaces.

Preferably, the phosphor comprises a powder which is incorporated within an epoxy resin, a silicone material or a polymer material to form a mixture and then the phosphor mixture is applied to the optical component to form a layer of phosphor on the optical component surface. To ensure a uniform light intensity output the phosphor mixture advantageously further comprises a light diffusing material.

Preferably, the optical component is fabricated from a plastics material or a glass.

The phosphor advantageously comprises a photoluminescent material having a formula $A2SiO_4:Eu^{2+}$ where A is a divalent metal selected from the group comprising Sr, Ca, Ba, Mg, Zn and Cd and D is a dopant selected from the group comprising F, Cl, Br, I, P, S and N.

According to third aspect of the invention there is provided a method of fabricating a lighting arrangement comprising: providing a radiation source configured to emit radiation having a first wavelength range and an optical component through which said radiation passes; and providing on a surface of the optical component a phosphor configured to absorb at least a portion of said first wavelength range radiation and emit radiation having a second wavelength range.

Advantageously the method further comprises providing the phosphor as a substantially uniform thickness layer on said surface of the optical component.

The optical component can have a substantially planar surface, convex or concave surfaces and the method comprises providing the phosphor on said substantially planar surface, convex or concave surfaces.

In one implementation the optical component has a substantially hemispherical surface and the method comprises providing the phosphor on said hemispherical surface. Preferably, the optical component comprises a substantially hemispherical shell and the method comprises providing the phosphor on the inner or outer hemispherical surfaces. Alternatively, the optical component can comprise a substantially spherical shell and the method comprises providing the phosphor on at least a part of the inner or outer spherical surfaces. In a further alternative arrangement the optical component comprises a hollow cylinder and the method comprises providing the phosphor on at least a part of the inner or outer surfaces.

The optical component is preferably fabricated from a plastics material or glass.

According to a further aspect of the invention there is provided a method of fabricating an optical component for a lighting arrangement of a type comprising a radiation source configured to emit radiation having a first wavelength range; a phosphor configured to absorb at least a portion of said first wavelength range radiation and emit radiation having a second wavelength range; and said optical component being configured such that at least said first wavelength range radiation passes through the optical component the method comprising providing said phosphor on a surface of the optical component.

To ensure uniform color conversion the method advantageously comprises providing the phosphor as a substantially uniform thickness layer.

When the optical component has a substantially planar surface the method preferably comprises providing the phosphor on said substantially planar surface.

Alternatively where the optical component has a convex or concave surface the method can comprise providing the phosphor on said convex or concave surfaces.

In yet a further alternative arrangement the optical component has a substantially hemispherical surface and the method comprises providing the phosphor on said hemispherical surface. Where the optical component comprises a substantially hemispherical shell the method comprises providing the phosphor on the inner or outer hemispherical surfaces. Moreover where the optical component comprises a substantially spherical shell the method comprises providing the phosphor on at least a part of the inner or outer spherical surfaces. Alternatively the optical component can comprise a hollow cylinder and the method comprises providing the phosphor on at least a part of the inner or outer surfaces.

In a preferred method the phosphor comprises a powder and the method comprises incorporating the phosphor within an epoxy resin or silicone material or polymer material to form a mixture and then applying the phosphor mixture to the optical component to form a layer of phosphor on the optical component surface. The mixture can be applied by painting the mixture onto the surface of the optical component, spraying or other known deposition techniques. When the phosphor is to be applied to a planar surface the optical component is then advantageously spun or tape casting to distribute the mixture uniformly over the surface to thereby ensure a uniform thickness of phosphor forms.

Advantageously the method further comprises incorporating a light diffusing material, for example titanium oxide, silica, alumina in the phosphor mixture. Alternatively the light diffusing material can be provided as a separate layer.

Advantageously, the phosphor comprises a photoluminescent material having a formula $A_2SiO_4:Eu^{2+}D$ where A is a divalent metal selected from the group comprising Sr, Ca, Ba, Mg, Zn and Cd and D is a dopant selected from the group comprising F, Cl, Br, I, P, S and N.

The method further comprises fabricating the optical component from a plastics material or glass.

For ease of fabrication, and in accordance with a particularly preferred method of the invention a plurality of optical components in the form of an array, said array of optical components having a common planar surface, and said phosphor is deposited on the planar surface. Advantageously, the phosphor is provided as a substantially uniform thickness layer on said planar surface of the array of optical components.

In accordance with a further aspect of the invention there is provided a phosphor material for coating an optical component of an LED comprising a phosphor powder incorporated within an epoxy resin, a silicone material or a polymer material. Advantageously the phosphor material further incorporates a light diffusing material.

In accordance with yet a further aspect of the invention there is provided an optical component for a lighting arrangement of a type comprising a radiation source configured to emit radiation having a first wavelength range; a phosphor configured to absorb at least a portion of said first wavelength range radiation and emit radiation having a second wavelength range; and said optical component being configured such that at least said first wavelength range radiation passes through the optical component, and characterized in that said phosphor is incorporated in said optical component.

DETAILED DESCRIPTION OF EMBODIMENTS OF THE INVENTION

In order that the present invention is better understood, embodiments of the invention will now be described by way of example only with reference to the accompanying drawings.

Figure 1:
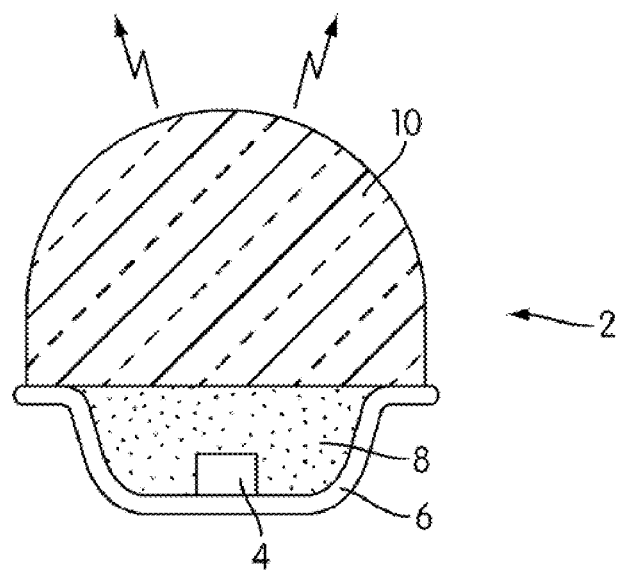
FIG. 1 is a schematic representation of a known white LED as already described.
Figure 2:
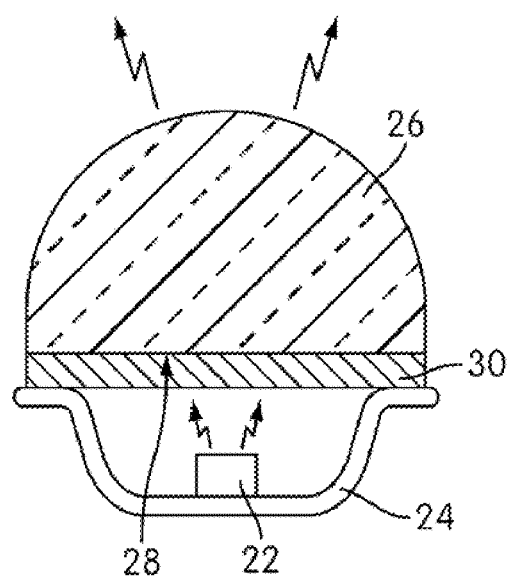
FIGS. 2 to 7 are schematic representations of LED lighting arrangements in accordance with the invention.

Referring to FIG. 2 there is shown a LED lighting arrangement 20 in accordance with the invention. The LED lighting arrangement 20 is for generating light of a selected color for example white light. The lighting arrangement comprises a LED chip 22, preferably a Gallium Nitride chip, which is operable to produce light, radiation, preferably of wavelength in a range 300 to 500 nm. The LED chip 22 is mounted inside a stainless steel enclosure or reflection cup 24 which has metallic silver deposited on its inner surface to reflect light towards the output of the lighting arrangement. A convex lens 26 is provided to focus light output from the arrangement. In the example illustrated the lens 26 is substantially hemispherical in form. The lens 26 can be made of a plastics material such as polycarbonate or glass such as silica based glass or any material substantially transparent to the wavelengths of light generated by the LED chip 22.

In the embodiment in FIG. 2 the lens 26 has a planar, substantially flat, surface 28 onto which there is provided a layer of phosphor 30 before the lens is mounted to the enclosure 22. The phosphor 30 preferably comprises a photoluminescent material having a formula $A_2SiO_4:Eu^{2+}D$ where A is a divalent metal selected from the group comprising Sr (Strontium), Ca (Calcium), Ba (Barium), Mg (Magnesium), Zn (Zinc) and Cd (Cadmium) and D is a dopant selected from the group comprising F (Fluorine), Cl (Chlorine), Br (Bromine), I (Iodine), P (Phosphorous), S (Sulfur) and N (Nitrogen) as disclosed in our co-pending patent application US 2006/0028122 the content of which is hereby incorporated by way of reference thereto. The phosphor which is in the form of a powder is mixed with an adhesive material such as epoxy or a silicone resin, or a transparent polymer material and the mixture is then applied to the surface of the lens to provide the phosphor layer 30. The mixture can be applied by painting, dropping or spraying or other deposition techniques which will be readily apparent to those skilled in the art. Moreover the phosphor mixture preferably further includes a light diffusing material such as titanium oxide, silica or alumina to ensure a more uniform light output.

The color of light emitted from the lighting arrangement can be controlled by appropriate selection of the phosphor composition as well as the thickness of the phosphor layer which will determine the proportion of output light originating from the phosphor. To ensure a uniform output color the phosphor layer is preferably of uniform thickness and has a typical thickness in a range 20 to 500 μm.

An advantage of the lighting arrangement of the invention is that no phosphor need be incorporated within the encapsulation materials in the LED package. Moreover the color of the light output by the arrangement can be readily changed by providing a different lens having an appropriate phosphor layer. This enables large scale production of a common laser package. Moreover such a lens provides direct color conversion in an LED lighting arrangement.

Figure 3:
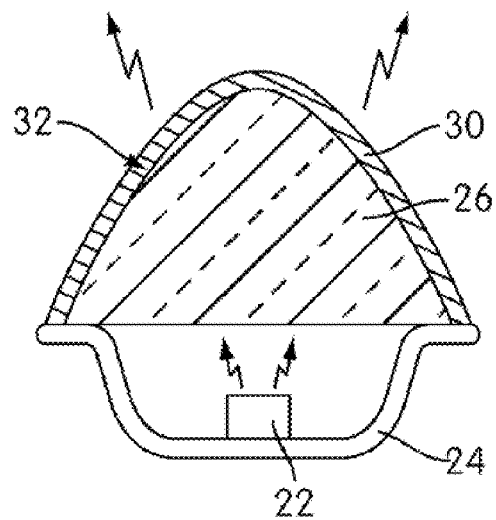

Referring to FIG. 3 there is shown an LED lighting arrangement in accordance with a further embodiment in which the phosphor 30 is provided as a layer on the outer convex surface 32 of the lens 26. In this embodiment the lens 26 is dome shaped in form.

Figure 4:
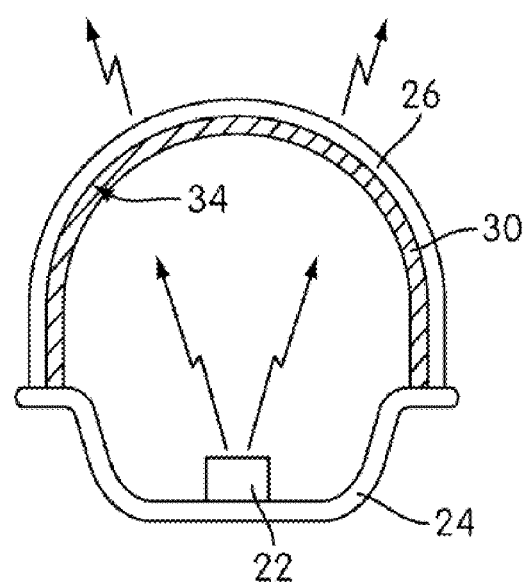

FIG. 4 shows an LED lighting arrangement in accordance with a further embodiment in which the lens 26 comprises a substantially hemispherical shell and the phosphor 30 is provided on the inner surface 34 of the lens 26. An advantage of providing the phosphor on the inner surface is that the lens 26 then provides environmental protection for the LED and phosphor. Alternatively the phosphor can be applied as a layer of the outer surface of the lens 26 (not shown).

Figure 5:
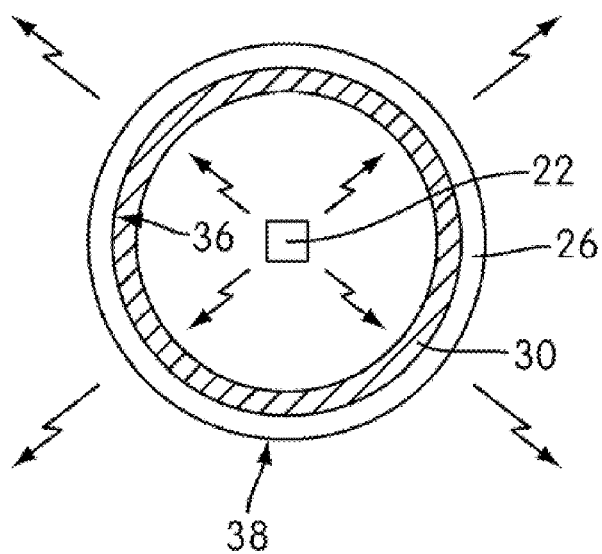

FIG. 5 illustrates an LED arrangement in which the lens 26, optical component, comprises a substantially spherical shell and the phosphor 30 is deposited as a layer on at least a part of the inner 36 or outer spherical 38 surfaces and the LED chip 22 is mounted within the spherical shell. To ensure uniform emission of radiation a plurality of LED chips are advantageously incorporated in which the chip are oriented such that they each emit light in differing directions. Such a form is preferred as a light source for replacing existing incandescent light sources (light bulbs).

Figure 6:
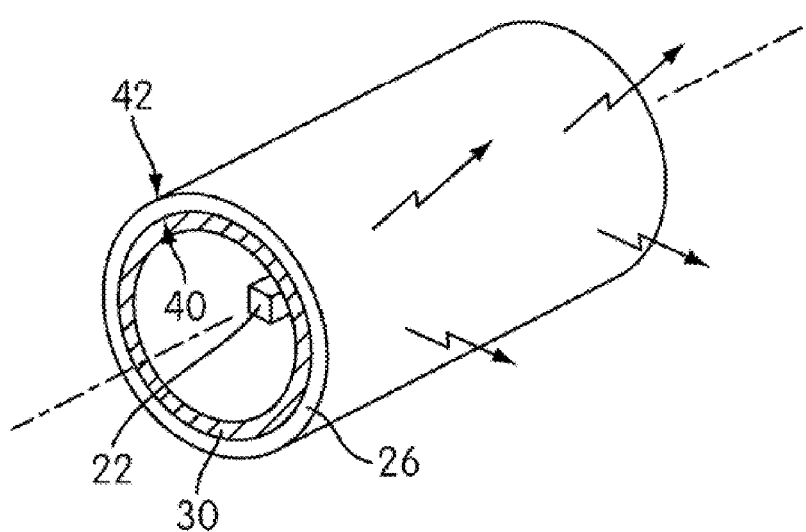

Referring to FIG. 6 there is shown a further arrangement in which the optical component 26 comprises a hollow cylindrical form and the phosphor is applied to the inner 40 or outer 42 curved surfaces. In such an arrangement the laser chip preferably comprises a linear array of laser chips that are arranged along the axis of the cylinder. Alternatively the lens 26 can comprise a solid cylinder (not shown).

Figure 7:
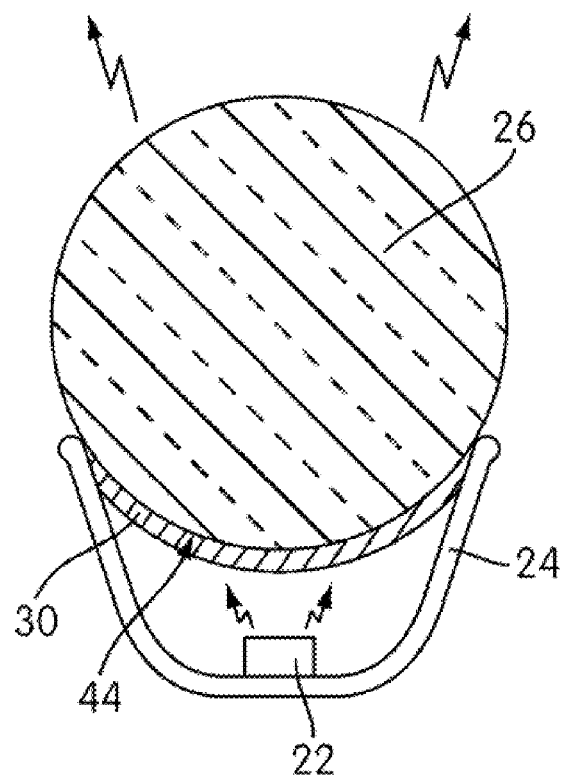

FIG. 7 shows an LED arrangement in which the optical component comprise a solid substantially spherical lens 26 and the phosphor is provided on at least a part of the spherical surface 44. In a preferred arrangement, as illustrated, the phosphor is applied to only a portion of the surface, which surface is then mounted within the volume defined by the enclosure. By mounting the lens 26 in this way this provides environmental protection of the phosphor 30.

Figure 8:
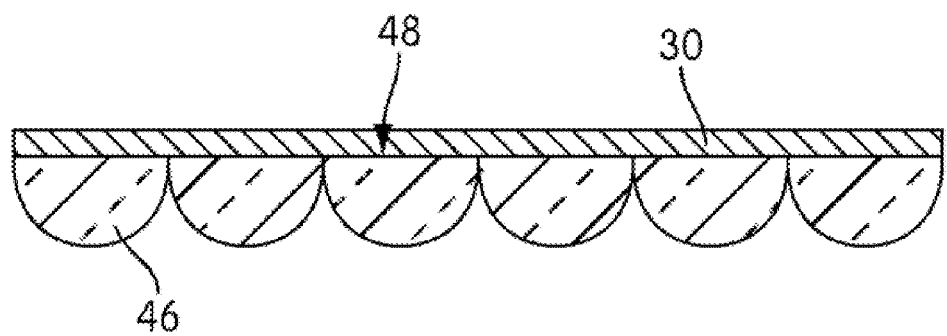
FIG. 8 is a schematic representation of a method of fabricating an optical component for an LED lighting arrangement in accordance with the invention.

Referring to FIG. 8 there is shown a preferred method of fabricating lenses in accordance with the invention. An array of lenses 46 is provided in which the lenses have a common planar surface 48 onto which the phosphor 30 is provided. In the example illustrated the lenses 36 are substantially hemispherical in form. After the phosphor has been deposited the lenses can be separated and mounted to the LED assemblies. Such a method is found to be particularly advantageous for mass production of the optical components.

It will be appreciated that the present invention is not restricted to the specific embodiments described and that modifications can be made which are within the scope of the invention. For example although in the foregoing description reference is made to a lens the phosphor can be deposited onto other optical components such as for example a window through which light passes though is not necessarily focused or directed or a waveguide which guides, directs, light. Moreover the optical component can have many forms which will be readily apparent to those skilled in the art.

It will be appreciated that the phosphor and LED chip can be selected depending on the intended application to provide light of a desired color. It is also envisaged to provide two or more phosphor materials to achieve the desired color, spectral content, of emitted light. The different phosphors can be provided by mixing the powdered material and incorporating them within a single layer or alternatively by providing multiple layers of different phosphors.

Examples of preferred phosphors are:

YAG-based phosphors which comprising a photoluminescent material having a formula (YA)3(AlB)5(OC)12:Ce3+ where A is a trivalent metal selected from the group comprising Gd (Gadolinium), Tb (Terbium), La (Lanthanum), Sm (Samarium) or divalent metal ions such as Sr (Strontium), Ca (Calcium), Ba (Barium), Mg (Magnesium), Zn (Zinc) and Cd (Cadmium), B comprising Si (Silicon), B (Boron), P (phosphorous), and Ga (Gadolinium) and C is a dopant selected from the group comprising F (Fluorine), Cl (Chlorine), Br (Bromine), I (Iodine), P (phosphorous), S (Sulfur) and N (Nitrogen);

orange-red silicate-based phosphors of general formula (SrM1)3Si(OD)5:Eu where M1 is selected from the group comprising Ba, Ca, Mg, Zn . . . and D is selected from the group comprising F, Cl, S, and N (such a phosphor can be used for emitting light in a wavelength range from green to yellow (580 to 630 nm));

red silicon nitride based phosphors of general formula of (SrM1)Si5N8 where M1 is selected from the group comprising Sr, Ca, Mg, and Zn;

red sulfate based phosphors having a general formula (SrM1)S where M1 is selected from the group comprising Ca, Ba, and Mg; and green sulfate based phosphors having a general formula (SrM1)(GaM2)2S4:Eu where M1 is selected from the group comprising Ca, Ba, and Mg, and where M2 is selected from the group comprising Al and In.

In addition to providing an LED lighting arrangement the invention further provides a novel optical component and method of fabrication thereof.

In a further embodiment it is also envisaged to incorporate the phosphor within material comprising the optical component. Moreover the phosphor can be provided as a layer on the encapsulating material.

What is claimed is:

1. A lighting arrangement comprising: a light reflective enclosure; at least one radiation source housed within the enclosure and operable to generate excitation light of a first wavelength range; a substantially spherical optical component mounted over the enclosure opening and at least one phosphor operable to absorb at least a portion of the excitation light and to emit light of a second wavelength range, wherein light generated by the arrangement comprises the combined light of the first and second wavelength ranges and wherein the at least one phosphor material is provided as a layer on at least a part of the surface of the optical component that is enclosed within the volume of the enclosure when the component is mounted to the enclosure.

2. The lighting arrangement according to claim 1, in which the inner surfaces of the enclosure comprise metallic silver.

3. The lighting arrangement according to claim 1, in which the enclosure comprises stainless steel.

4. The lighting arrangement according to claim 1, in which the phosphor layer is of thickness in a range 20 to 500 μm.

5. The lighting arrangement according to claim 1, in which the optical component is made from one of a plastics material, a polycarbonate, a glass and a silica glass.

6. The lighting arrangement according to claim 1, in which the at least one phosphor has a general formula $A_2SiO_4$:$Eu^{2+}D$ where A is a divalent metal selected from the group consisting of Sr, Ca, Ba, Mg, Zn and Cd and D is a dopant selected from the group consisting of F, Cl, Br, I, P, S and N.

7. The lighting arrangement according to claim 1, in which the at least one phosphor has a formula $(YA)_3(AlB)_5(OC)_{12}$:$Ce^{3+}$ where A is a trivalent metal selected from the group consisting of Gd, Tb, La, Sm or divalent metal ions such as Sr, Ca, Ba, Mg, Zn and Cd; B is selected from the group consisting of Si, B, P, and Ga; and C is a dopant selected from the group consisting of F, Cl, Br, I, P, S and N.

8. The lighting arrangement according to claim 1, in which the at least one phosphor comprises an orange-red silicate-based phosphor having a formula $(SrM1)_3Si(OD)_5$:Eu where M1 is selected from the group consisting of Ba, Ca, Mg, Zn . . . ; and D is selected from the group consisting of F, Cl, S, and N.

9. The lighting arrangement according to claim 1, in which the phosphor comprises a red silicon nitride based phosphor having a formula $(SrM1)Si_5N_8$ where M1 is selected from the group consisting Sr, Ca, Mg, and Zn.

10. The lighting arrangement according to claim 1, in which the phosphor comprises a red sulfate based phosphor having a formula $(SrM1)S$ where M1 is selected from the group consisting of Ca, Ba, and Mg.

11. The lighting arrangement according to claim 1, in which the phosphor comprises a green sulfate based phosphor having a formula $(SrM1)(GaM2)_2S_4$:Eu where M1 is selected from the group consisting of Ca, Ba, and Mg, and M2 is selected from the group consisting of Al and In.

12. The lighting arrangement according to claim 1, in which the at least one phosphor comprises a powder which is incorporated within one of an light transmissive epoxy resin, a silicone material and a polymer material.

13. The lighting arrangement according to claim 11, and further comprising incorporating a light diffusing material with the phosphor powder.

14. The lighting arrangement according to claim 12, in which the light diffusing material is selected from the group consisting of: titanium oxide, silica and alumina.

15. The lighting arrangement according to claim 1, in which the at least one radiation source comprises a light emitting diode.

16. The lighting arrangement according to claim 14, in which the light emitting diode comprises a gallium nitride LED light emitting diode.

17. The lighting arrangement according to claim 1, in which said at least one radiation source is operable to emit light having a wavelength in a range of 300 to 500 nm.

18. The lighting arrangement according to claim 1, in which the at least one phosphor is configured to emit radiation light having a wavelength in a ranging from 450 to 700 nm.

19. The lighting arrangement according to claim 1, in which the arrangement is operable to generate white light.

20. A lighting arrangement comprising: a light reflective enclosure; at least one light emitting diode housed within the enclosure and operable to generate light having a wavelength ranging from 300 to 500 nm; a solid substantially spherical optical component mounted over the enclosure opening and at least one phosphor operable to absorb at least a portion of the light emitted by the light emitting diode and to emit light having a wavelength ranging from 450 to 700 nm, wherein light generated by the arrangement comprises the combined light emitted by the light emitting diode and the at least one phosphor and is configured to appear white in color and wherein the at least one phosphor material is provided as a layer on at least a part of the surface of the optical component that is enclosed within the volume of the enclosure when the component is mounted to the enclosure.

21. An optical component for a lighting arrangement comprising: a light reflective enclosure; at least one radiation source housed within the enclosure and operable to generate excitation light of a first wavelength range; at least one phosphor operable to absorb at least a portion of the excitation light and to emit light of a second wavelength range, wherein light generated by the arrangement comprises the combined light of the first and second wavelength ranges and wherein the optical component is a substantially spherical and the at least one phosphor material is provided as a layer on at least a part of the surface of the optical component that is enclosed within the volume of the enclosure when the component is mounted to the enclosure opening.

* * * * *